United States Patent
Grummon

(10) Patent No.: US 7,690,621 B2
(45) Date of Patent: Apr. 6, 2010

(54) PRESTRAINED THIN-FILM SHAPE MEMORY ACTUATOR USING POLYMERIC SUBSTRATES

(75) Inventor: David S. Grummon, East Lansing, MI (US)

(73) Assignee: Board of Trustees Operating Michigan State University, East Lansing, MI (US)

( * ) Notice: Subject to any disclaimer, the term of this patent is extended or adjusted under 35 U.S.C. 154(b) by 810 days.

(21) Appl. No.: 10/553,309

(22) PCT Filed: Apr. 15, 2004

(86) PCT No.: PCT/US2004/011702

§ 371 (c)(1),
(2), (4) Date: Oct. 14, 2005

(87) PCT Pub. No.: WO2004/092581

PCT Pub. Date: Oct. 28, 2004

(65) Prior Publication Data

US 2007/0034818 A1 Feb. 15, 2007

Related U.S. Application Data

(60) Provisional application No. 60/462,923, filed on Apr. 15, 2003.

(51) Int. Cl.
*F16K 31/00* (2006.01)
(52) U.S. Cl. .................. 251/11; 29/594; 204/192.14; 427/331
(58) Field of Classification Search ............ 204/192.14, 204/192.15; 427/130, 331; 251/11; 137/341; 148/402, 563; 29/594, 25.35
See application file for complete search history.

(56) References Cited

U.S. PATENT DOCUMENTS

| 4,538,642 A | 9/1985 | Schutten et al. |
| 4,864,824 A | 9/1989 | Gabriel et al. |
| 5,061,914 A | 10/1991 | Busch et al. |
| 5,325,880 A | 7/1994 | Johnson et al. |
| 5,619,177 A * | 4/1997 | Johnson et al. .......... 337/140 |

(Continued)

FOREIGN PATENT DOCUMENTS

EP     0 161 952 A     11/1985

(Continued)

OTHER PUBLICATIONS

Krulevitch et al., Thin Film Shape Memory Alloy Microactuators, 1996, Journal of Microelectromechanical Systems, vol. 5, No. 4, pp. 270-281.*

*Primary Examiner*—John K. Fristoe, Jr.
*Assistant Examiner*—Marina Tietjen
(74) *Attorney, Agent, or Firm*—Harness, Dickey & Pierce, P.L.C.

(57) ABSTRACT

A method for producing a plurality of thin film actuators is disclosed. The method includes depositing a film of a shape memory alloy material onto a polyimide film to form a shape memory alloy construction. The shape memory alloy construction is strained from 2 to 8%. Post processing is conducted on the shape memory alloy construction after the step of imparting a 2 to 8% strain. This post processing can be the deposition of additional layers of the slicing of the actuators. Various shape memory metal actuators are disclosed.

32 Claims, 19 Drawing Sheets

U.S. PATENT DOCUMENTS

| | | | |
|---|---|---|---|
| 5,825,275 A | 10/1998 | Wuttig et al. | |
| 5,836,066 A * | 11/1998 | Ingram | 29/90.7 |
| 6,236,300 B1 | 5/2001 | Minners | |
| 6,543,110 B1 * | 4/2003 | Pelrine et al. | 29/25.35 |
| 6,655,011 B1 * | 12/2003 | Kornrumpf et al. | 29/622 |
| 6,689,486 B2 * | 2/2004 | Ho et al. | 428/610 |
| 6,773,535 B1 * | 8/2004 | Wetzel | 156/247 |
| 2001/0021290 A1 * | 9/2001 | Ishida et al. | 385/22 |
| 2002/0007958 A1 * | 1/2002 | Rivelli et al. | 174/102 R |
| 2002/0046783 A1 * | 4/2002 | Johnson et al. | 148/219 |
| 2002/0112788 A1 * | 8/2002 | Tanaka et al. | 148/402 |
| 2002/0177891 A1 * | 11/2002 | Parodi | 623/1.15 |
| 2003/0020502 A1 * | 1/2003 | Sugihara et al. | 324/754 |
| 2003/0062254 A1 * | 4/2003 | Choi et al. | 204/192.3 |
| 2003/0074053 A1 * | 4/2003 | Palmaz et al. | 623/1.15 |
| 2003/0074503 A1 * | 4/2003 | Echartea et al. | 710/104 |
| 2004/0074065 A1 * | 4/2004 | Cheng et al. | 24/442 |
| 2004/0191556 A1 * | 9/2004 | Jardine | 428/610 |
| 2005/0159808 A1 * | 7/2005 | Johnson et al. | 623/1.18 |

FOREIGN PATENT DOCUMENTS

WO     WO-96/39547 A     12/1996

* cited by examiner

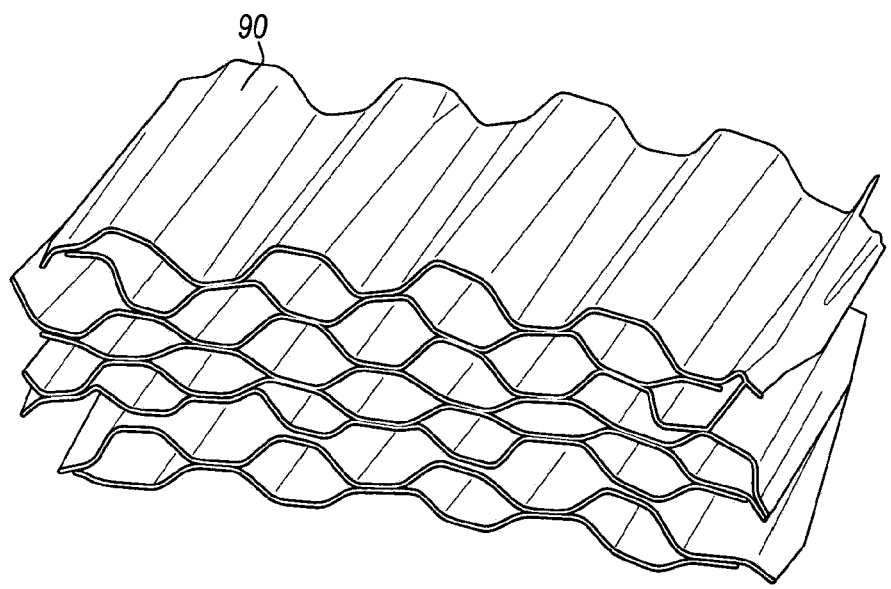
FIG. 14
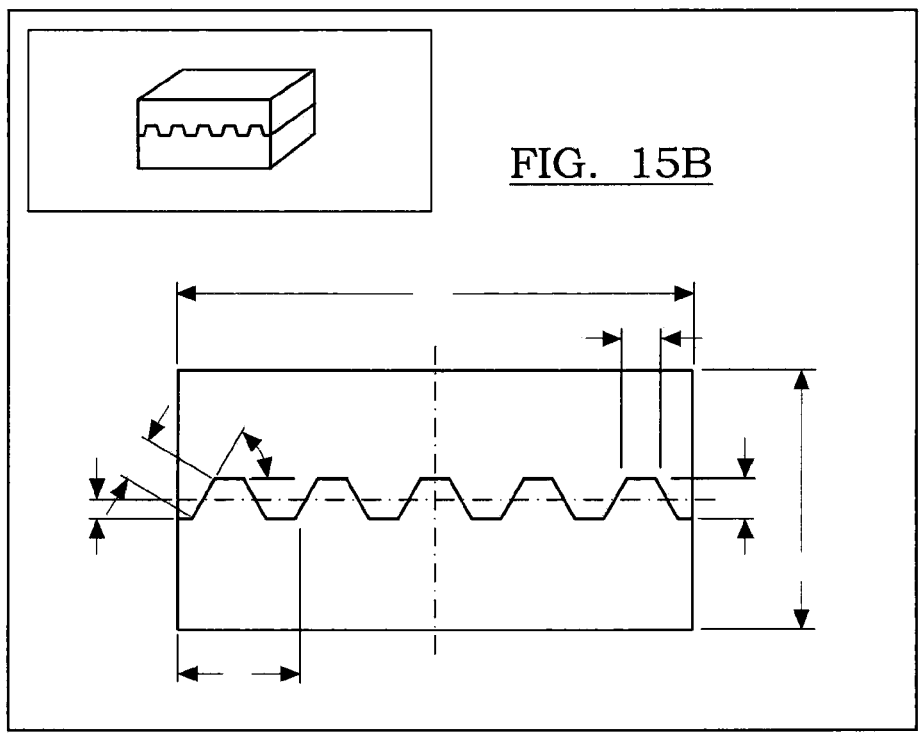
FIG. 15B
FIG. 15A

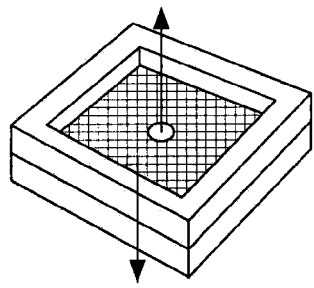 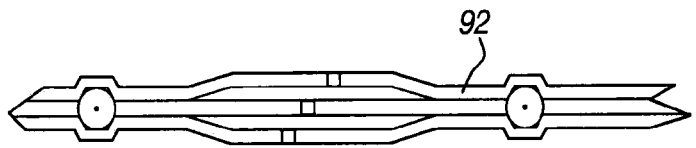
FIG. 16A          FIG. 16B
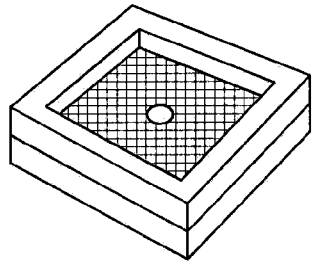 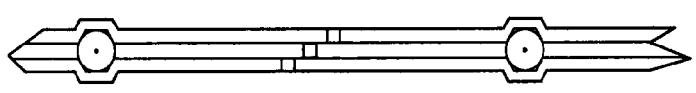
FIG. 16C          FIG. 16D
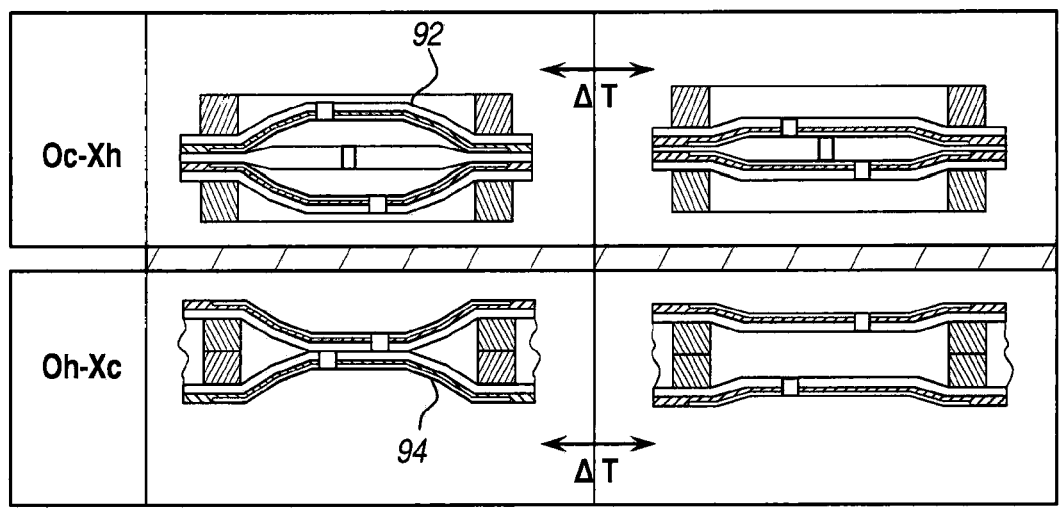
FIG. 17

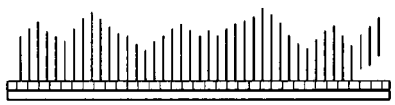
FIG. 19a
FIG. 19b
FIG. 19c
FIG. 19d
FIG. 19e
FIG. 19f
FIG. 19g
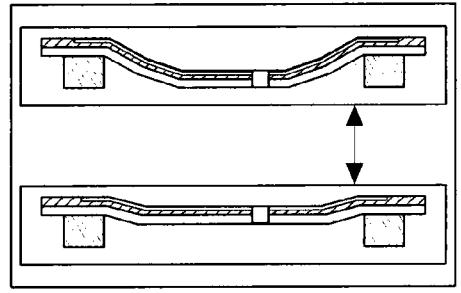
FIG. 19h
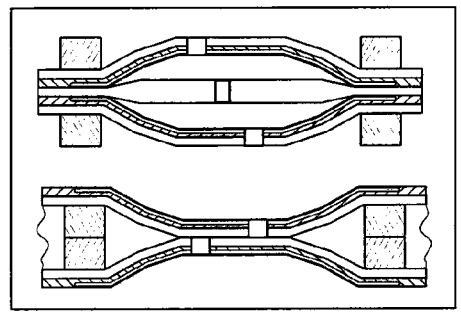
FIG. 19i FIG. 24b
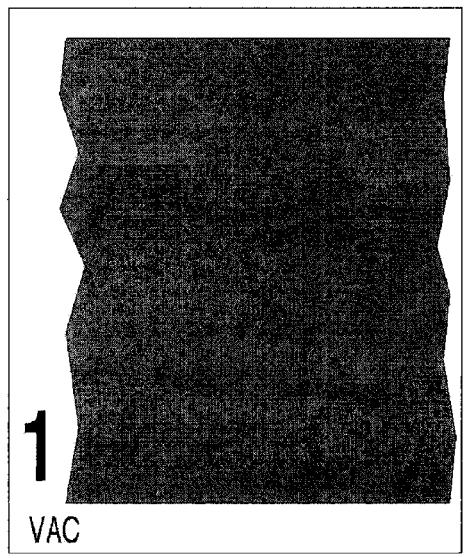
FIG. 24c
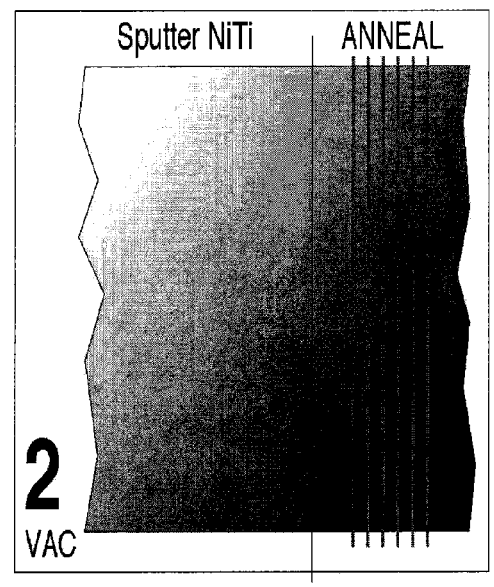
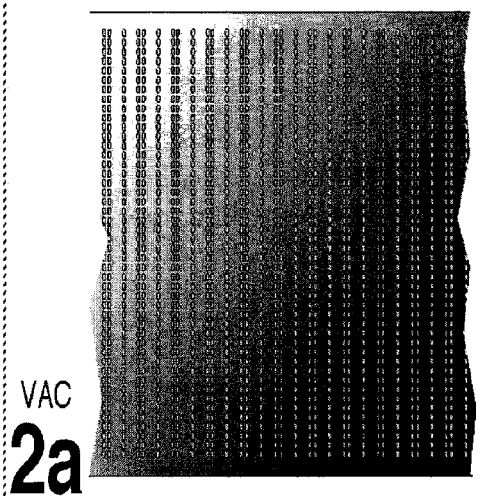
FIG. 24d
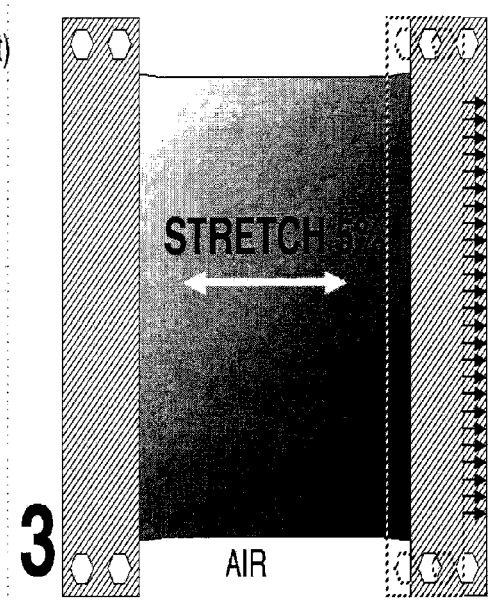
FIG. 24e FIG. 24f
Coat | Expose
4
AIR | AIR
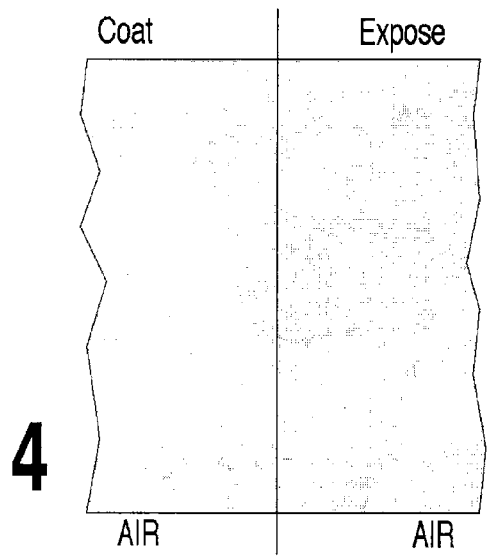
FIG. 24g
DEVELOP
5
Liq.
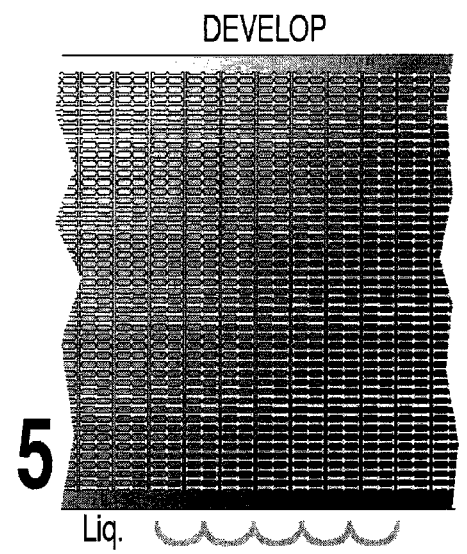
Etch Metal and Strip
Patterned TiNi on KPI
Liq.
6
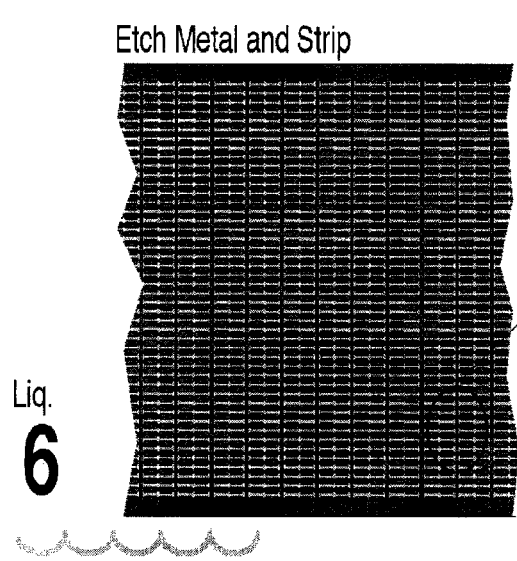
FIG. 24h

STRIP

Actuators with finished end treatments

10

SLIT

11

PRESTRAINED THIN-FILM SHAPE MEMORY ACTUATOR USING POLYMERIC SUBSTRATES

FIELD OF THE INVENTION

The present invention relates to physical forms and methods for fabrication of electrically excitable thin-film shape-memory linear actuators and adaptive membrane materials. The shape-memory film is sputter-deposited onto a polymeric substrate film and pre-stretched in a martensitic state prior to post-stretch processing and subsequent delivery to an end-user.

BACKGROUND & SUMMARY OF THE INVENTION

The actuators described here are designed to be universally and generally adaptable to a variety of mechanical linear and membrane actuation functions in which it is desired to produce linear, rotary, or out-of-plane membrane displacement, in each case capable to operate against substantial reaction forces. Unlike currently available shape-memory alloy (SMA) wires, sheets and plates, the thin, flat form of the SMA film disclosed herein maximizes heat transfer rate to allow more rapid cyclic actuation. Prior use of thin films of SMA materials has been confined to the deposition of films onto rigid substrates such as silicon, limiting their use to planar elements which are not amenable to the pre-straining required to obtain maximum shape-memory strain recovery. In the present invention, the use of a polymeric substrate gives the actuator a "carrier film" that greatly facilitates handling and installation, while the thin, flat form of the SMA provides a large surface area for easy and secure attachment. Alternatively, two-dimensional membranes may be fabricated that may express a variety of adaptive mechanical responses to environmental stimuli or which may be controlled by externally applied energy input.

Prior SMA cyclic actuator systems using wires, springs or sheets require users to impart strains into the martensitic phase of an SMA material before use, to provide 'biasing' forces to reset the actuator to a starting position on cooling. These straining operations often require substantial mechanical complexity and are generally not applicable to thin films deposited onto rigid substrates. The method of pre-straining the actuator prior to delivery to the user allows simplified installation of the actuator element into a mechanical device without the requirement that an external mechanism provide either the biasing forces needed for cyclic actuation, or the pre-strain needed for a cyclic shape-memory effect to be enabled. Furthermore, the prestraining step envisioned in the present invention can be applied for a sufficient number of thermomechanical cycles to stabilize the hysteretic behavior of the actuator, eliminating "shake-down" behaviors such as cyclic creep.

The material system described will allow fabrication of uniaxial, multiaxial or membrane actuators will be readily adaptable to cyclic displacement requiring no additional spring elements. Generation of rotary displacements can be effected by using combinations of three or more linear actuators, and out of plane displacement of membrane actuators can be effected by simple surface modifications of the pre-strained sheet material.

The manufacturing process includes thin film deposition, thermomechanical pre-straining, photolithographic patterning, and surface modification, in a continuous process capable of delivering large numbers of finished devices, or large areas of adaptive membrane material, at low cost. For electrically excited linear actuators the provision, by photolithography, of "hairpin" patterns in the SMA metal film simplifies incorporation of the actuator with electrical power supplies. For two-dimensional membrane embodiments, biaxial pre-straining of the SMA metallization allows for the development of cyclic out-of plane displacements through the incorporation of planar elastic layers by surface modification, as described further below.

The disclosed system also takes advantage of the complementary constitutive properties of the SMA metallization and the polymeric carrier film. That is, the SMA layer stiffens and returns to a preset shape when heated, whereas the underlying polymeric layer, when heated, becomes more compliant, and when cooled stiffens and tends to return to its original shape or length. The polymeric web can also function as an electrical and thermal insulator, disposed between SMA metallic layers deposited on both sides of the web, in configurations that allow for large cyclic out-of-plane displacements. In general, the thickness of the polymeric web is such that the mechanical response of the actuator is dominated by the properties and behavior of the SMA metallization.

Processing is described that will allow for low-cost, high-volume manufacture of actuation elements at size scales ranging from sub-millimeter to as much as tens meters in length, or patterned mechanically active membranes whose areas can exceed 1 meter square. Although free-standing shape memory thin films have been previously made, it is difficult to separate such films from their substrates without causing damage to the film. The provision of the polymeric substrate greatly toughens the SMA film, allowing easy handling during subsequent deployment by the end-user. Furthermore, the flexible substrate allows the SMA metallization to be photolithographically patterned into complex functional forms while retaining the sealing integrity of the membrane. Patterning of the active SMA metallization by photolithographic methods also allows, for example, subsequent slitting and/or die cutting operations to be carried out without damaging the edge of the SMA metallization.

After pre-straining and photolithographic patterning, SMA elements can also be provided with local regions having greatly increased elastic stiffness through the use of simple procedures, such as selective-area electroplating, to provide, for example, reinforced end-connection sites and solder tabs.

The fabrication technology used to produce the thin film electrically excited actuators above has excellent potential for ultra-low cost manufacture of small linear and actuators, with enormous flexibility accruing from the batch-style primary materials processing (including the critical pre-stretching step), combined with postprocessing for patterning and end-treatment. The same basic process can also be used to fabricate both discrete linear actuators, complex three-dimensional multiaxial actuation systems, or adaptable "intelligent" membranes, with dimensions that can be measured in meters, having an arbitrarily complex patterned arrays containing high thin film shape-memory "action-centers". Locally functional thin-film machines can be configured to respond to a variety of potential stimuli, such as thermal gradients across the membrane, applied electrical currents, or even to directed energy from remote irradiation sources such as lasers or electron beams. Alternatively, membranes are disclosed with two-sided metallization that, when supplied with DC power, can use local sensors and control circuitry attached directly to the membrane to control local action functions in response to environmental stimuli.

The membranes can be designed to express such novel properties such as variable heat transfer coefficients, adjustable acoustical response, alterable surface contour (at scales), controllable damping behavior, roll-unroll or fold-unfold functionality, and/or adjustable radio-frequency diffraction/reflection/absorption characteristics.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 14 represents an alternate 3-dimensional structure;

FIGS. 15a-15b represent a perspective and side views of the tool used to form the structure of FIG. 14;

FIGS. 16a-16d represent blister valve members according to the teachings of the present invention;

FIG. 17 represents the functioning of the valve members shown in FIGS. 16a-16d;

DETAILED DESCRIPTION OF THE PREFERRED EMBODIMENTS

The following description of the preferred embodiments is merely exemplary in nature and is in no way intended to limit the invention, its application, or uses.

Figure 1:
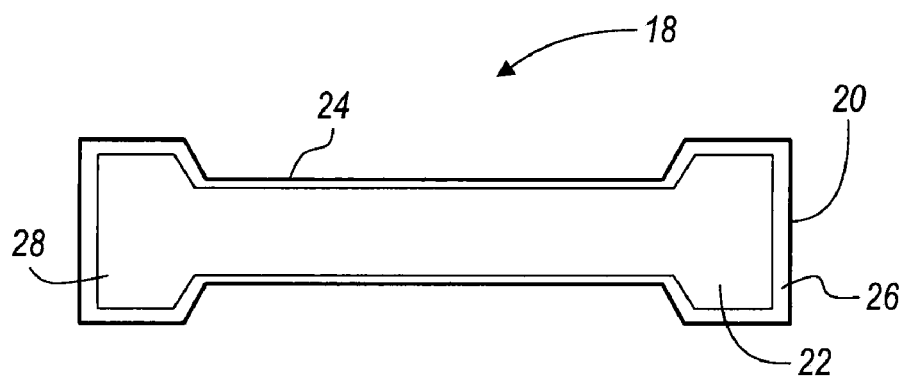
FIG. 1 represents an actuator element according to the teachings of the present invention.
Figure 2:
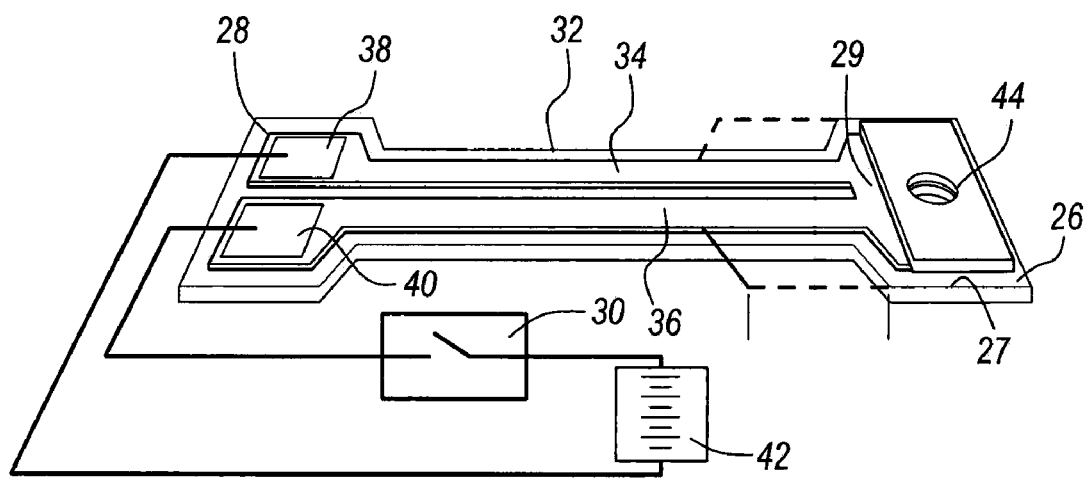
FIG. 2 represents an alternate actuator.

As shown in FIG. 1, in its simplest form, the actuator 18 consists of a thin polymeric substrate 20 (such as 7.6 micron thick Kapton HN or VN film or similar polymers such as UBE Inc. Upilex polyimide film, capable of withstanding high temperatures in vacuum without significant degradation) onto which a metallic film 22 having shape-memory properties is deposited using sputter-deposition or other suitable physical-vapor deposition process. The shape-memory alloy (SMA) film 22 can range in thickness from less than one to over 25 microns. The actuators 18 can produce well in excess of 10 Newtons (~2.5 pounds) of axial force. The linear actuator 18 is patterned to have a medial reduced section 24, which is the active portion where electrical energy is dissipated as heat, and enlarged ends 26 and 28 for mechanical attachment and electrical connections attachment. As shown in FIG. 2, additional photolithographic process steps may be included to provide locally stiffened regions 38, 40 and 44 that are suited for mechanical attachment and/or soldering to provide electrical contact.

One aspect of the present invention is to pre-stretch the metallized sheet, during the manufacturing process, while the SMA is in its martensitic (cool) condition, in order to "program" the actuator 18 to exhibit a linear contraction of from 1 to 6% of the active length when current is passed through it. As described below, this pre-stretch operation is conducted prior to further processing steps that form the final actuator structure. The pre-stretch step may optionally be carried out for a number of cycles to effect cyclic shake-down of the actuator performance before delivery to the end user. In this process the metallized polymeric web is repeatedly cycled from below the martensite finish temperature to above the austenite finish temperature while the film is subjected to continuous mechanical loading of sufficient intensity to deform the martensitic film by as much as 5%.

Electrical current may be applied through the SMA layer utilizing a suitable controller 30. It is envisioned that the controller 30 can be either external to or affixed to the substrate 26 using surface mount electronic devices. The shape-memory alloy film 22 is preferably NiTi intermetallic compound or related shape-memory metal such as TiNiPd, TiNiHf, or TiNiPt. The specific material is chosen to give desired actuation and service temperatures between –100 centigrade and as high as 500 centigrade.

The polyimide substrate 20 is a widely used flexible printed circuit board material onto which actuators 18 can be easily integrated with sensors, conducting traces, analog electronic devices and computing circuitry such as the controller 30. Ready-to-install actuators with on-board microcontroller circuitry are especially useful for radial multi-actuator arrays. Deposition onto the polymeric substrate 20 may either produce a continuous metal film layer, or may be done in the presence of masks designed to produce a pattern in the metal film that defines special shapes for a multiplicity of actuators in the metal layer (such as reduced-sections and enlarged ends on a linear actuator element).

FIG. 2 represents an alternate actuator 32 according to the teachings of the present invention. Actuator 32 has a pair of generally parallel actuator shape memory films 34 and 36 deposited on a top surface 27 of the polymeric substrate 20. The parallel actuator films 34 and 36 are electrically coupled together by a conductor bridge 29 disposed there between. Optionally, the actuator assembly can take the form of a double-hairpin wherein the metallic bridge at center is simply for axial force-transfer. Formed on one of the enlarged ends 28 is a pair of electrical contacts 38 and 40 for electrically coupling the actuator 32 to a controller 30 and its associated power supply 42.

Figure 3:
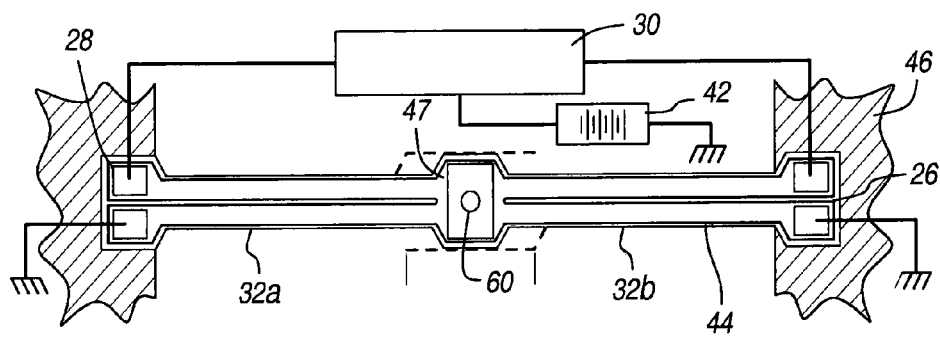
FIGS. 3-4 represent top and side views of an alternate actuator according to the teachings of the present invention.

In FIG. 3, both ends 26 and 28 of a 2-element actuator are fixed and attached to the electrical controller 30. The center 47 is free to move bi-directionally and does so with a large force output as each actuator is individually excited by the controller. This is an antagonistic actuator in which the individual excitation and contraction of one element imparts a strain to the opposing element which is recoverable by way of the shape-memory effect, thus allowing two-way cyclic operation without the use of additional mechanical biasing elements. The arrangement may be deployed with additional mechanical components such as the lever arm to generate a variety of motions, as shown in FIG. 4.

The actuator assembly uses a pair of actuators 32a and 32b as shown in FIG. 3. Disposed between the pair of actuators 32a and 32b is a medial bearing element 56 which functions to couple the actuator elements 32a and 32b to an optional lever arm 48. The enlarged ends 26 and 28 are mechanically attached (or soldered) to a support structure 46.

Figure 4:
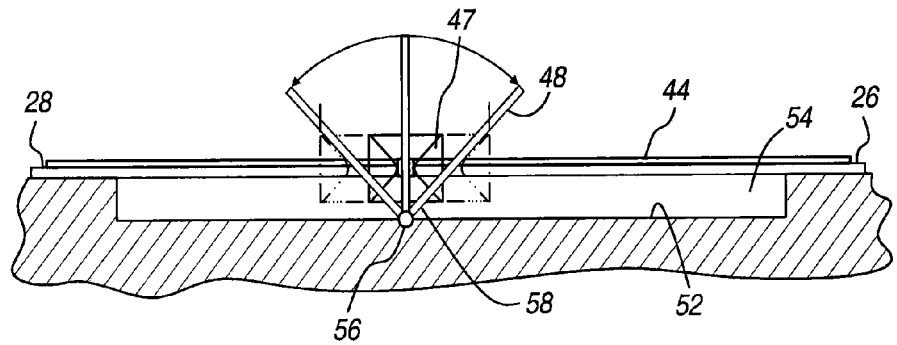

As best seen in FIG. 4, the actuators 32a and 32b are disposed over a support subsurface 52 to define a cavity 54 between the actuators 32a and 32b and the subsurface 52. Defined on the subsurface 52 is a bearing 56 that pivotably accepts a first end 58 of the lever 48. The lever 48 is further disposed within an aperture 60 defined in the medial bearing element 47. As can be seen in FIG. 4, actuation of either of the actuators 32a or 32b causes the lever arm 48 to move back and forth. By lengthening the lever arm 48, the amount of displacement attributable to the actuator 44 is increased. Movement of the interface location between the lever arm 48 and the bearing element 47 allows for adjustment of the mechanical advantage of the actuator.

FIGS. 5a-5f depict various configurations utilizing a plurality of actuators shown in FIG. 1 or 2, all such actuator elements having been simultaneously fabricated on a single sheet of polymeric web material. While the actuator assemblies 34 shown in FIGS. 3 and 4 are capable of linear movement, the actuator assemblies depicted in FIGS. 5a-5f are configured to allow planar circular movement of the actuator central attachment point when the individual elements are separately excited by a controller that provides proper phasing of the electrical excitation.

Figure 5A:
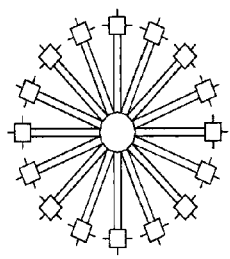
FIGS. 5a-5f represent alternate planar actuators.
Figure 5B:
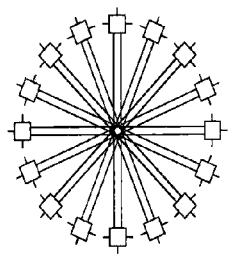
Figure 5C:
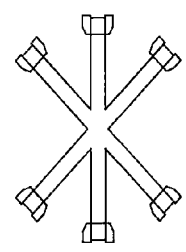
Figure 5D:
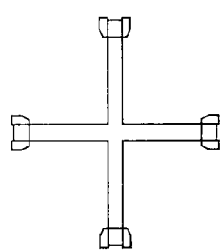
Figure 5E:
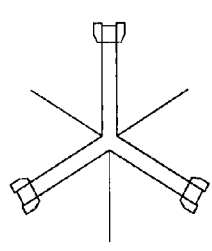
Figure 5F:
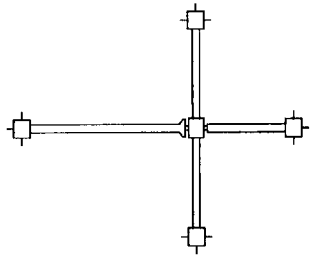
Figure 6A:
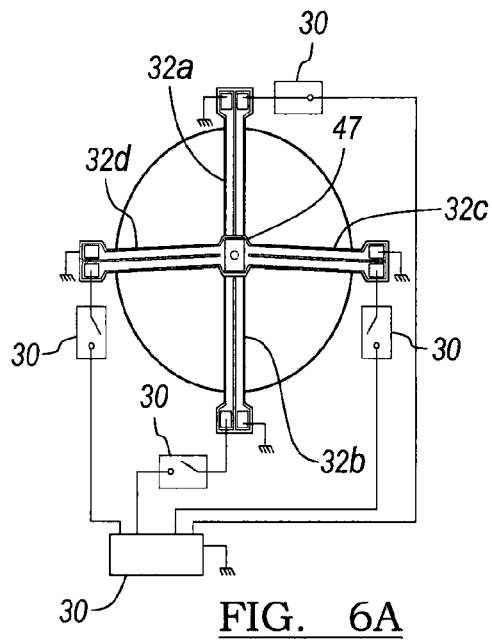
FIGS. 6a-6d represent the use of the actuator shown in FIG. 5d.
Figure 6B:
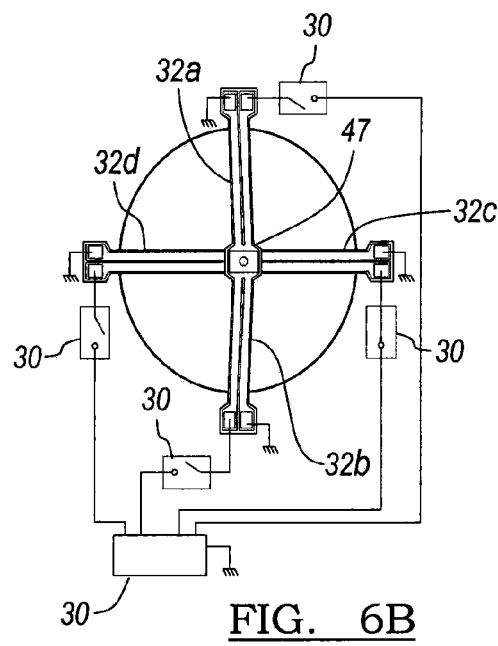
Figure 6C:
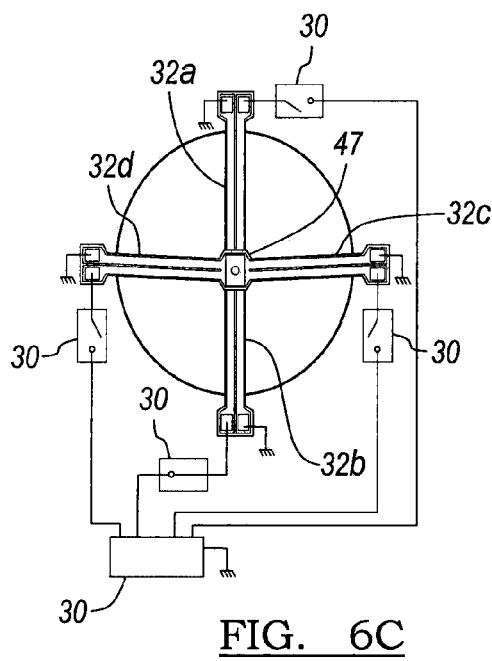
Figure 6D:
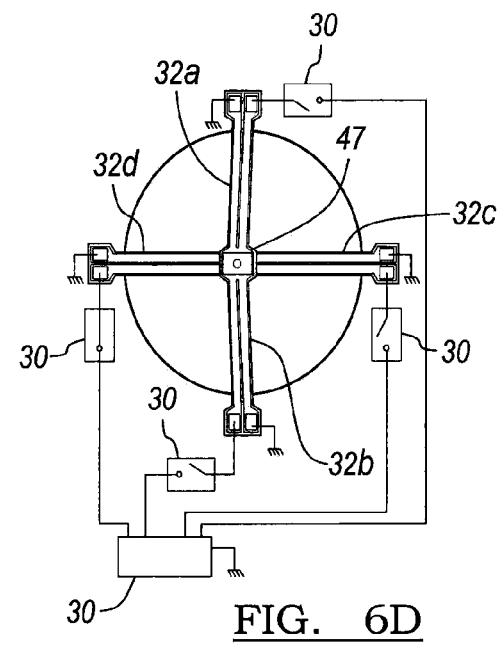

FIGS. 6a-6d depict the use of the actuator assembly depicted in FIG. 5d. As can be seen, the controller 30 has applied current to the actuator 32a, causing contraction of that actuator 32a and subsequent displacement of the medial bearing member 47. FIGS. 6b-6d depict the serial actuation of various actuator elements 32b-32d and the subsequent movement of the medial bearing element 47 which describes an approximately circular path.

Figure 7:
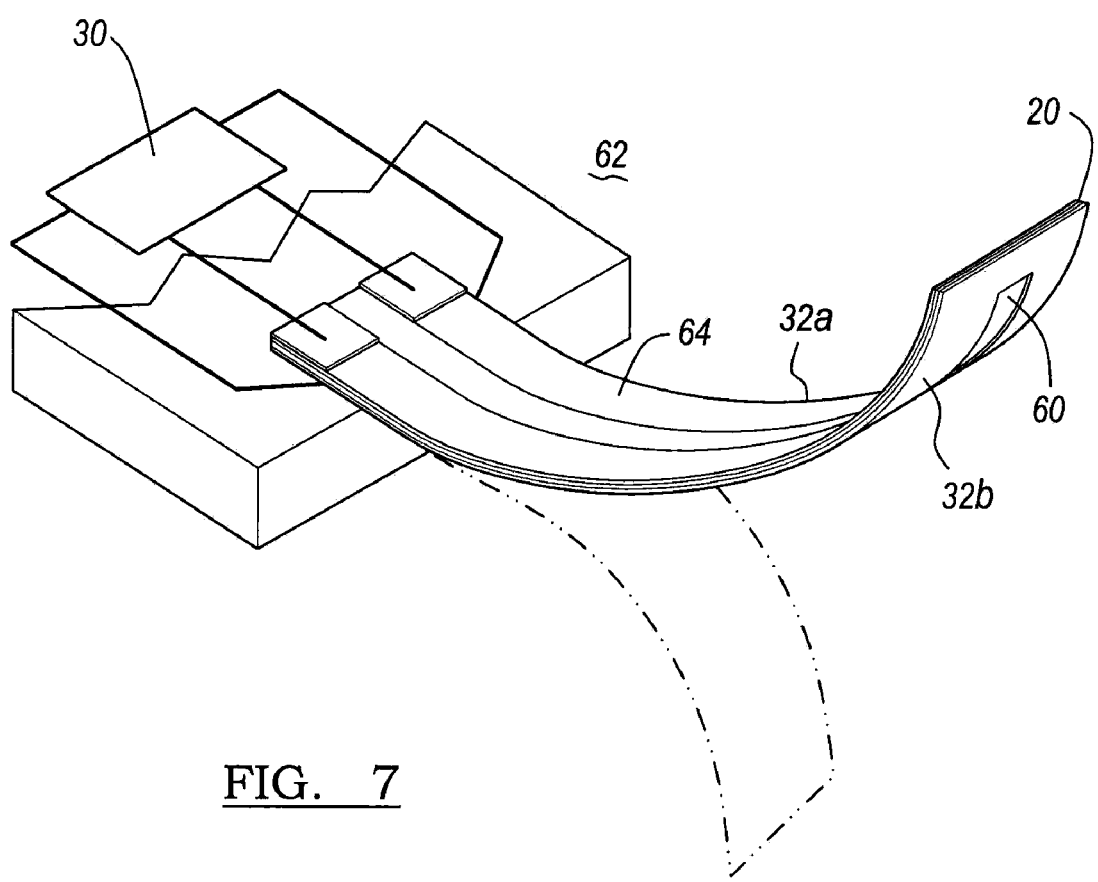
FIGS. 7-8 represent out-of-plane actuators.

FIG. 7 depicts an alternate actuator assembly 62 according to another embodiment of the present invention. Shown is a pair of actuators 32a and 32b disposed on the polymer substrate 20. The first actuator 32a is disposed on a top surface 64 of the substrate, while the second actuator 32b is disposed on a second side 66 of substrate 20. The central polymeric layer provides both electrical and thermal isolation between the SMA layers on either side. The actuator 62 is configured to induce cyclically reversible out-of-plane displacements of the substrate 20 by applying current, and, therefore heat, from the controller to either one of the actuators 32a or 32b. Once again, excitation of one side induces a tensile strain in the SMA layer on the opposite side, allowing for cyclic actuation without additional biasing elements. The magnitude of the actuation displacement can be adjusted by varying the thickness of the central polymeric layer. Because of the photolithographic nature of the manufacturing method, actuators 62 could be made almost arbitrarily small, and hundreds of individual actuators could be incorporated in a single device less than one square inch in area.

Figure 8:
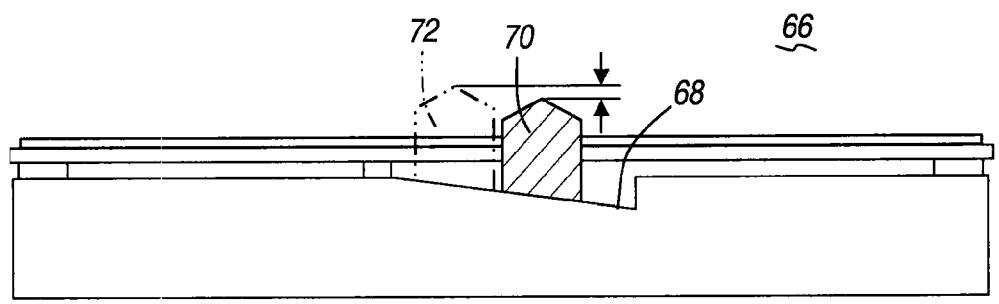

FIG. 8 depicts a side view of an actuator 66 according to the teachings of another embodiment of the present invention. The actuator 66 utilizes an angled bearing surface 68 to allow for out-of-plane displacement of an actuating arm 70. Horizontal displacements 72 of the actuating arm 70 causes the actuator arm 70 to traverse the angled surface 68 and, thereby, cause out-of-plane displacement of the actuator element.

Figure 9:
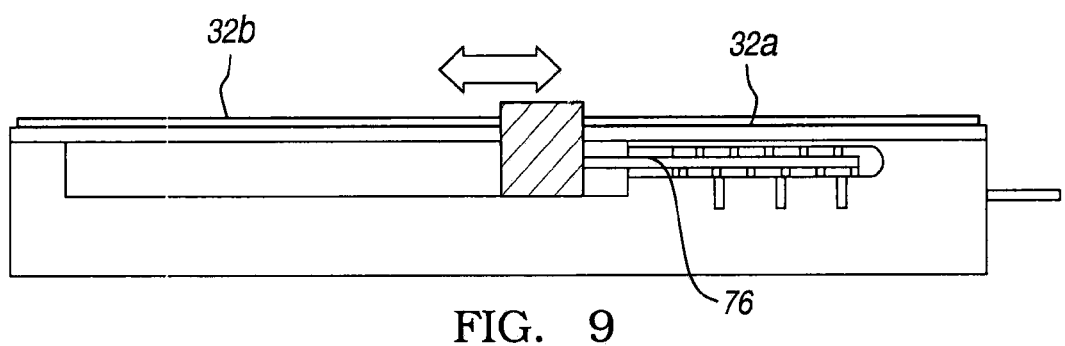
FIG. 9 represents and actuator having an DVRT sensor.

It is envisioned that the actuators can be integrated with positional feedback features that will overcome limitations of traditional shape memory actuators with regard to non-linearity, hysteresis, and drift due to fatigue. One approach is to attach a miniature DVRT 76 (differential variable-reluctance transducer) to the work-point of a dual-opposed actuator that permits real-time determination of work-point position and closed-loop servo-control of the actuator as shown in FIG. 9.

Figure 10:
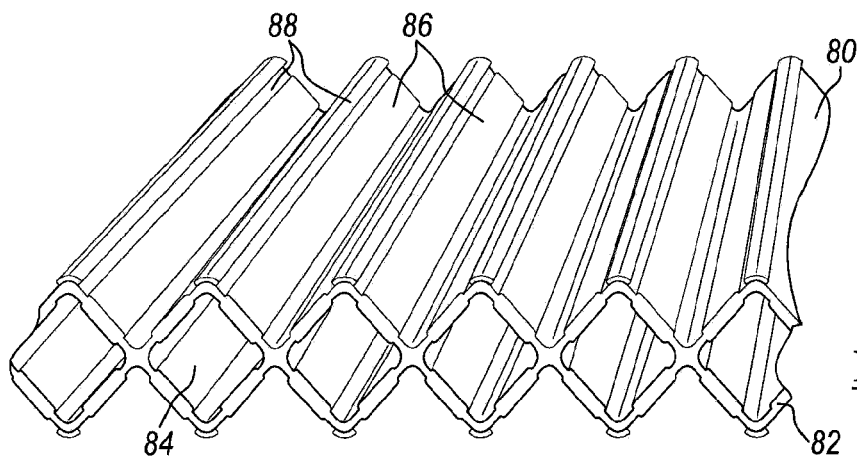
FIG. 10 represents a perspective view of a 3-dimensional actuator structure according to the teachings of the present invention.

FIG. 10 represents a perspective view of a 3-dimensional SMA controlled membrane structure according to the teaching of the present invention. Shown is a pair of polyimide substrates 80, 82. Each substrate has a plurality of folds which form an accordion shaped structure. The pair of substrates 80 and 82 are adhesively or ultrasonically bonded along the folds to form a structure having a plurality of linear cells 84. Disposed on the folded substrates are a plurality of generally rectangular metallic structures 86 designed for efficient heat conduction when pressed together, but when pulled apart have relatively low net thermal conductivity in a direction perpendicular to the plane of the sheet.

The support structures 86 are plated onto the substrate 80 and 82 in the form of conductor structures which are formed of copper, silver or gold. While strips are shown for simplicity, the support structure 86 can take the form of button-like geometries and can incorporate self-stiffening ribs. Disposed between the plated support structure heat conductors 86 is a shape memory film 88. The SMA film is biased and programmed for reversible bending shape strain. These TiNi films are located at locations generally adjacent to the fold structures and can be configured to have varying SMA properties.

Figure 11:
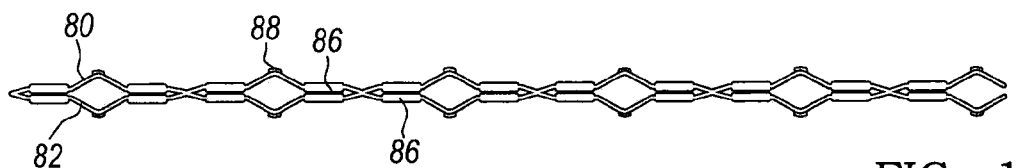
FIG. 11 represents a collapsed side view of the structure shown in FIG. 10.
Figure 12:
FIG. 12 represents a collapsed 3-dimensional structure utilizing the structure shown in FIG. 10.

FIG. 11 represents a single collapsed 3-dimensional structure as shown in FIG. 10. The structure shown has a high transverse heat transfer coefficient. It is envisioned that the system can be configured either to be open when warm, or to be open when cool. When "open", K is low and when closed K is low, where K is the transverse thermal conductivity of the membrane.

Figure 13:
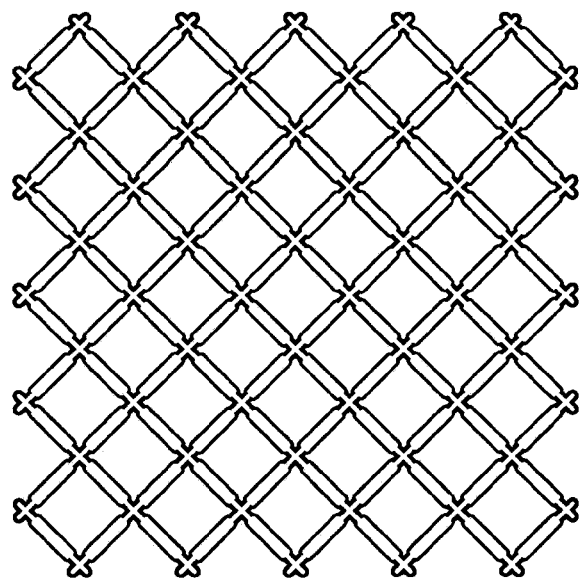
FIG. 13 represents an expanded 3-dimensional structure of the structures shown in FIG. 12.

FIG. 13 represents an expanded 3-dimensional structure of the structures shown in FIG. 10. By using multiple bonding structures, significant displacement and shape change as well as changes in material properties can be accomplished. Furthermore, the formation of the longitudinal cavities upon actuation of the SMA members significantly changes the membrane's transverse heat transfer coefficient.

FIG. 14 represents an alternate 3-dimensional structure 90. The structure 90 shown is formed of bonded and coated polyimide sheets. The sheets are bonded together to form a cellular structure similar to corrugated cardboard. This embodiment employs a shape memory film intended for use at temperatures above the austenite finish temperature such that the metal film will display isothermal shape-memory (pseudoelasticity) by the formation of stress-induced martensite upon loading so as to exhibit a high degree of energy absorption capability in a lightweight material.

FIGS. 15a and 15b represent perspective and side views of the two-piece tool, or "corrugation die", used to deform the polyimide sheet to form the corrugated structure. The corrugated form is established as the "set" shape by annealing the film between the corrugation dies at elevated temperature.

In addition to fabrication of linear actuators, the present invention allows for the manufacture of two-dimensional thermomechanically active membrane systems. Such systems utilize thermally-activated thin film displacements, in a multiplicity of locally patterned SMA elements, to control the physical, thermal, optical, acoustic or chemical characteristics of a two-dimensional sheet of arbitrary size.

FIGS. 16a and 16b represent blister valve members 92 and 94 according to the teachings of the present invention. The blister valve members 92 and 94 provide thermally activated vent pores configured with deliberate misalignment so as to be effectively opened (allowing moisture throughput) when cool. When warmed past a critical temperature, the pores would close, making the membrane a vapor barrier. This has the advantage that moisture would not condense on the membrane when cold. The blister valve members 92 and 94 therefore act as a vapor barrier only under conditions that would not lead to condensation.

As shown in FIG. 17, the blister valve members have two modes of operation. First, an inner layer contracts, flattens the blisters, and strains outer passive elastic layer. Second, when the blister valve is cooled, an outer elastic layer energy strains the as-forming martensite and thus resets the blister, which is now bubbled when cold, flattened when hot. Functionality (Open cold—closed hot or Open hot—closed cold) determined by nature of assemble.

Figure 18:
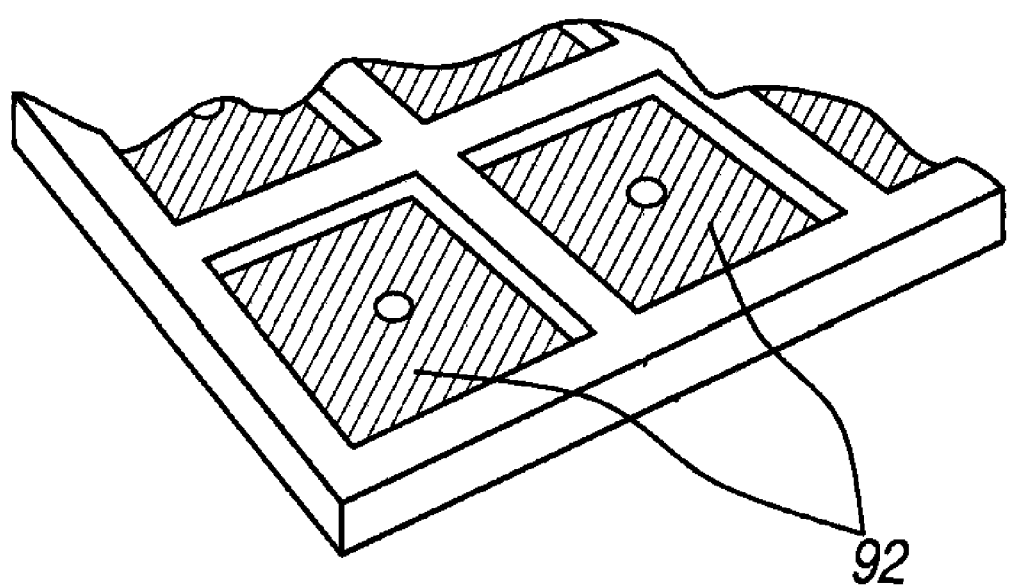
FIG. 18 represents a structure utilizing the blister valve members according to FIG. 16a FIGS. 19a-19i represent the methods for forming the members of FIGS. 16a-17d.

FIG. 18 represents an alternate structure using stiffening members according to the teachings of the present invention. The structure utilizes a plurality of blister valve mechanisms 92 and 94 shown in FIG. 16 as well as stringers between support structure members. In this regard, the structural frame can be disposed between a plurality of polyimide web members. In doing this, it is envisioned that microscopic valve members can be formed.

FIGS. 19a-19i represent the production of the valve members shown in FIGS. 16a-16d. Martensitic film is "blistered" by applying differential fluid pressure across the locally supported membrane. Two blistered sheets bonded together make a sealed bubble surrounded by prestrained martensite. As described below, the outer surface is modified to frustrate SMA contraction and induce out of plain movement.

The first step (20a) entails degassing a polyimide film. The layer is then sputter coated with TiNi (20b). The coated film is then heat treated and cooled to form martensitic TiNi. The film is then positioned over a support structure and subjected to differential pressure at temperature $<T_1$ (20e). In this step, the film is plastically deformed to the preferred "blister" shape.

Next, the interior surface of the blister is subjected to heavy ion irradiation at an ion energy chosen to produce crystal lattice damage to a depth of about one-half the thickness of the SMA film (20f). For example, 5 MeV argon ions will penetrate to a depth of approximately 1.5 to 2 micrometers. In this regard, the martensite is irradiated with heavy ions such as argon or krypton which damage the crystal structures to a degree that reverse transformation to the austenite is prevented. Only a low ion dose of approximately $10^{15}$ ions per square centimeter is required to sufficiently damage the lattice. By adjusting the energy of the incoming heavy ions, the affected depth may be readily adjusted to between 100 nanometers and 5 micrometers. By radiating at an energy which "poisons" the transformation from martensite to austenite transformation only to a depth of about one-half the film thickness, the pre-programmed contraction of the undamaged layer during heating will result in a pronounced out-of-plane deformation of the film.

Furthermore, since the heavily damaged layer will be in a state of elastic bending after heating, the strain energy contained therein will be available to deform the martensite on later cooling to below $M_f$. In this way, the cyclically repeatable two-way deformation will have been programmed.

Figure 20A:
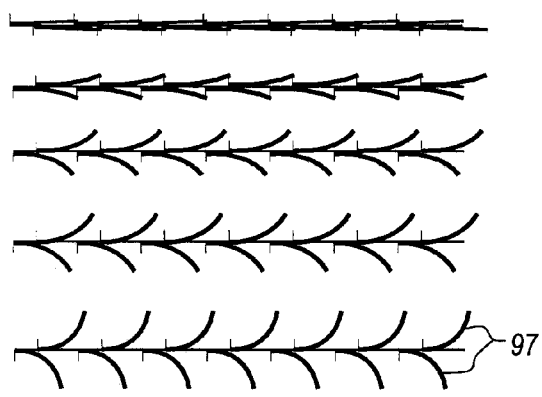
FIG. 20a-20b represent an alternate 3-dimensional structure.
Figure 20B:
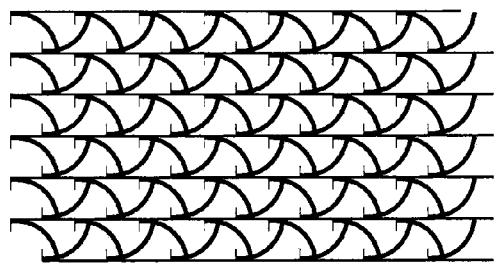
Figure 21A:
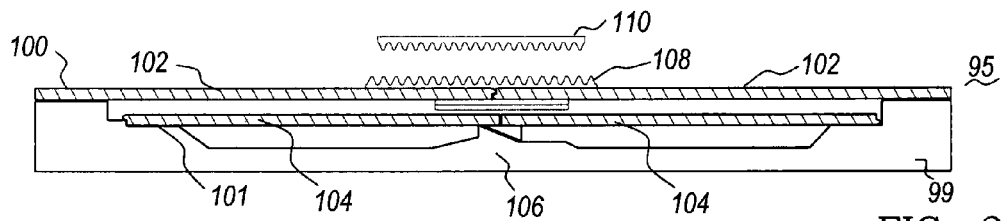
FIGS. 21a-21f represent a linear engine according to the present invention.
Figure 21B:
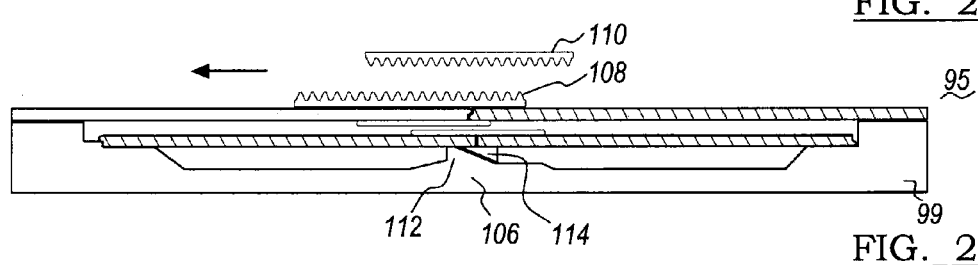
Figure 21C:
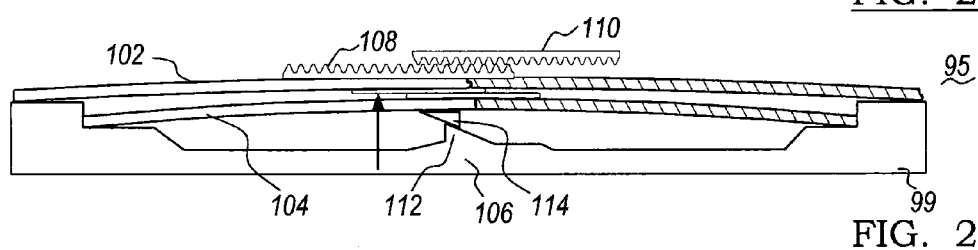
Figure 21D:
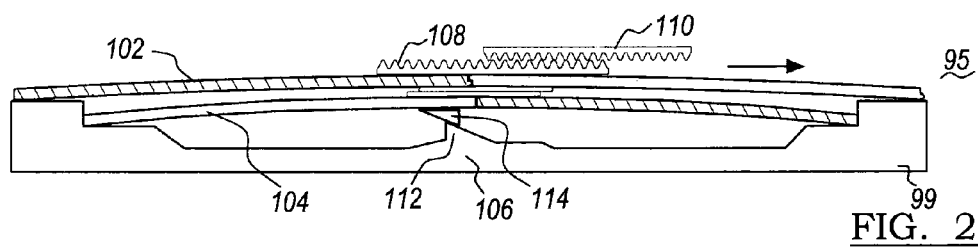
Figure 21E:
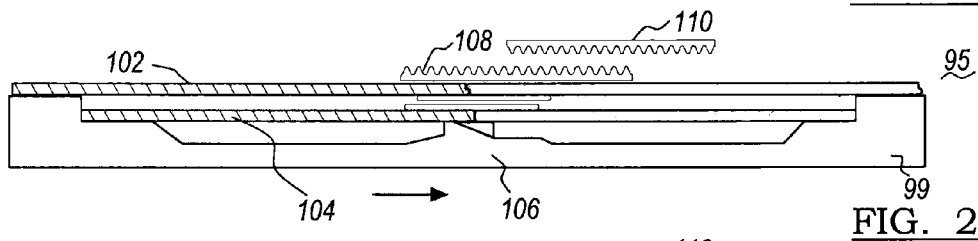
Figure 21F:
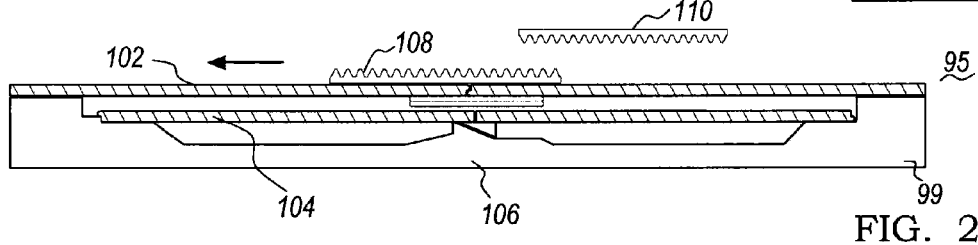

Alternatively, it is envisioned that other conventionally elastic, non SMA materials, may be disposed over the pre-stretched SMA layer to provide a similar out of plane deformation and elastic energy storage functions. FIGS. 20a-20b represent an alternate expandable member according to the teachings of the present invention. This particular structure 97 utilizes a plurality of members which have been prepared as previously mentioned method to allow for out-of-plane deformation. By subjecting the stretched martensite to irradiation as previously mentioned, heating causes the members to curl about a predetermined axis.

The pre-prepared members 97 can be fixably coupled to a substrate layer which are, in turn, bonded to other similar constructions. When stacked, and subsequently heated, the curvature of the pretreated members causes separation of individual substrate layers. As shown in FIG. 20b, these members 97 can be coupled to a single side of the substrate or, additionally, the layers can be coupled on dual sides of the substrate.

FIGS. 21a-21f represent a first linear walker 95 according to the present invention. The linear walker has a support structure 99 having first and second bearing surfaces 100, 101 for supporting first and second thin film counter posed actuators 102, 104 such as that shown in FIG. 3. Both the uppermost actuator 102 and the lower actuator 104 are able to move the central work point 106 in two directions in a cyclically repeatable manner. The uppermost actuator 102 is provided with teeth 108 capable of engaging a complimentary set of teeth 110 on the object to me moved.

Disposed on one surface of the support structure is a ramp 112 which is configured to interface with the corresponding ramp 114 attached to the lower actuator such that back and forth motion of the lower actuator's central work point results in vertical displacement of the central work point of both top and bottom actuators. Vertical displacement of the top actuator 102 allows the teeth 108 thereon to engage the complimentary teeth 110 on the object to be moved. Disposed between the top and bottom actuator layers is a relatively low friction area 112 which allows the easy sliding of top and bottom actuators with respect each other.

With general reference to FIGS. 22b-22e, the function of the linear walker will be described. FIG. 22b shows the actuation of the topmost thin film actuator to cause the movement of the first teeth 108 portion in a first direction relative to the teeth 110 of the object to be moved. As can be seen, the lower thin film actuator 104 is positioned so there is no interference between the ramp 112 of the base or the actuator assembly. As such, the teeth 108 on the upper actuator are not engaged with the teeth 110 of the object.

As shown in FIG. 22c, current is then applied to the left hand side bottom most actuator 104 so as to cause linear movement of the ramp 112 in the first direction. In this regard, the ramp 114 of the thin film linear actuator interfaces with the ramp 112 of the substrate so as to cause a transverse, or vertical, displacement topmost film in a direction perpendicular to the film plain. In this regard, the teeth 108 of topmost actuator are displaced vertically so as to the teeth 110 of the object to be moved.

In FIG. 22d, current is applied to the right hand side of the topmost actuator causing displacement of both sets of the teeth 108, 110 in a second direction. It should be noted that the films between the top and bottom actuators allow the sliding of the top actuator with respect to the bottom actuator without disengagement of the ramp structures 112, 114.

FIG. 22e represents a current being applied to the left side of the bottom thin film actuator. As shown, the ramp structures disengage, allowing the teeth 108, 110 associated with the topmost actuator to move downward thus disengaging the teeth on the object to be moved. It is envisioned that the cycle can then be repeated as shown in FIGS. 21b-21e.

Figure 22:
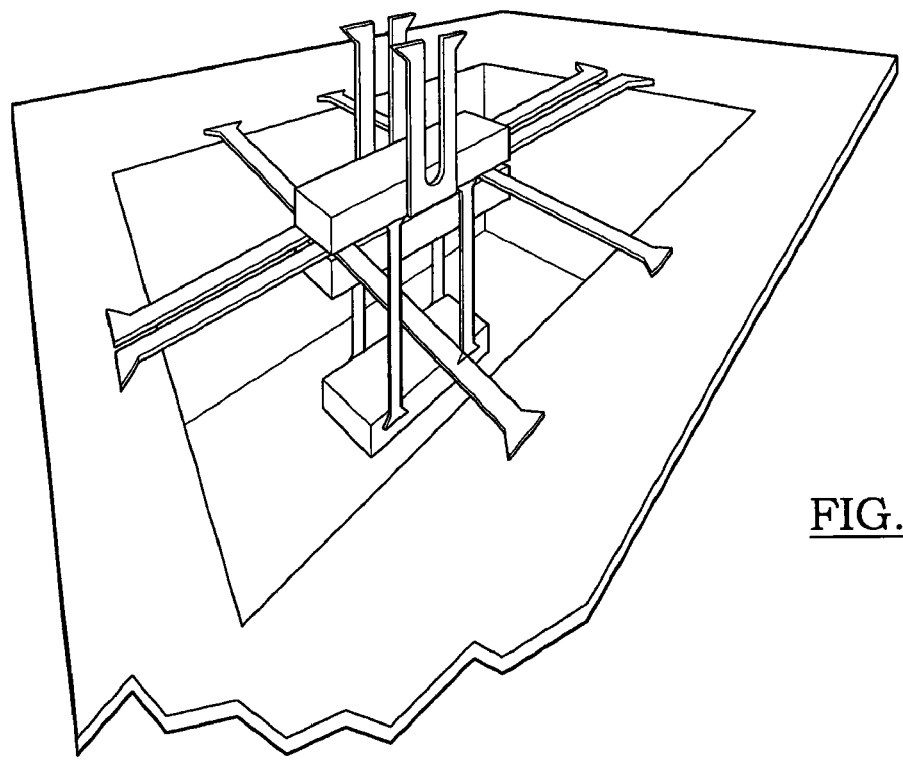
FIG. 22 represents a 3-dimensional actuator structure.

FIG. 22 represents a 3-dimensional structure composed of a multiplicity of linear actuators having been manufactured on a single polymeric substrate, prestrained, provided with end-treatments for ease of attachment. The film is then bent and fixed into the three-dimensional form shown in the figure. This figure exemplifies the high degree of versatility and complexity afforded by the method of prestraining the thin film actuators prior to deployment by the end-user.

Figure 23:
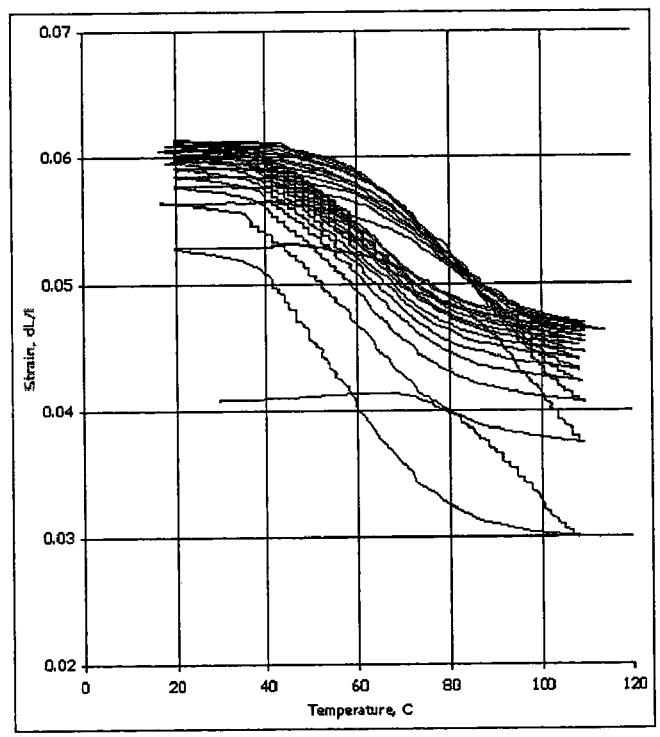
FIG. 23 represents temperature vs strain properties of the actuators of the present invention.

FIG. 23 represents temperature vs strain properties of the actuators of the present invention. Actual date strain vs. temperature is shown for the first 15 cycles of thermal cycling at a constant stress of 100 MPa. The specimen was a 5 micron thick sputtered TiNi film deposited on 7.6 micron thick UBE Upilex polyimide film. The plot shows the shakedown behavior of the actuator in which nominally stable hysteresis was achieved after ~15 thermal cycles.

Figure 24A:
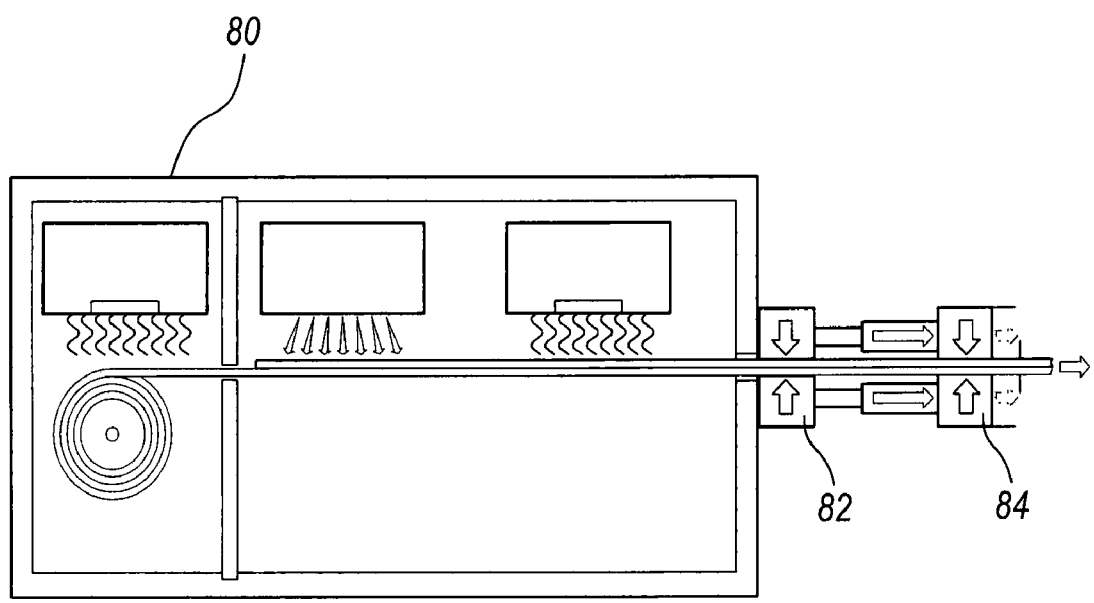
FIG. 24a-24n represents the formation of the actuators shown in FIGS. 1 through 23.
Figure 24I:
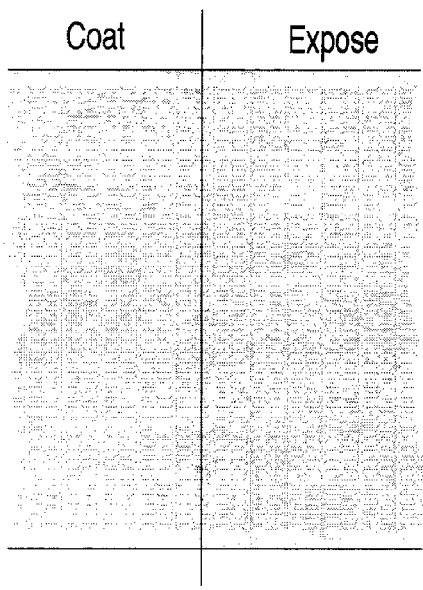
Figure 24J:
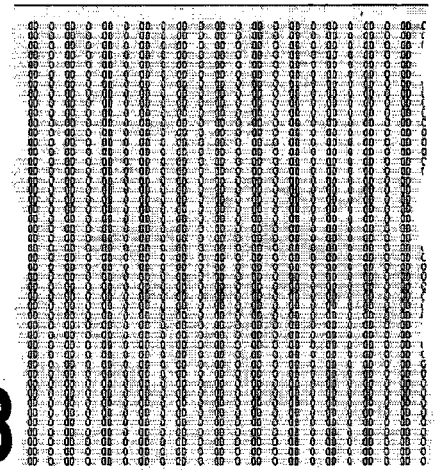
Figure 24K:
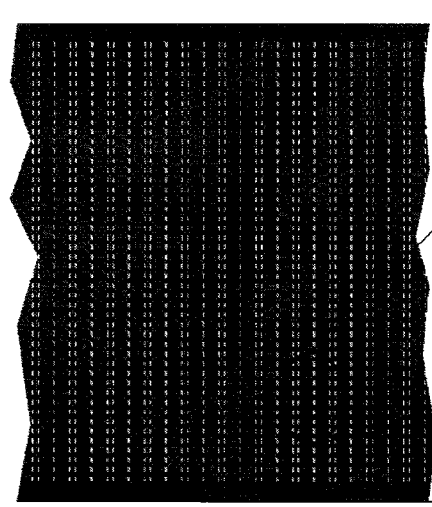
Figure 24K:
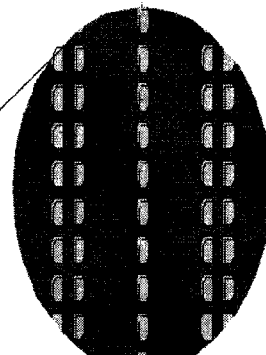
Figure 24L:
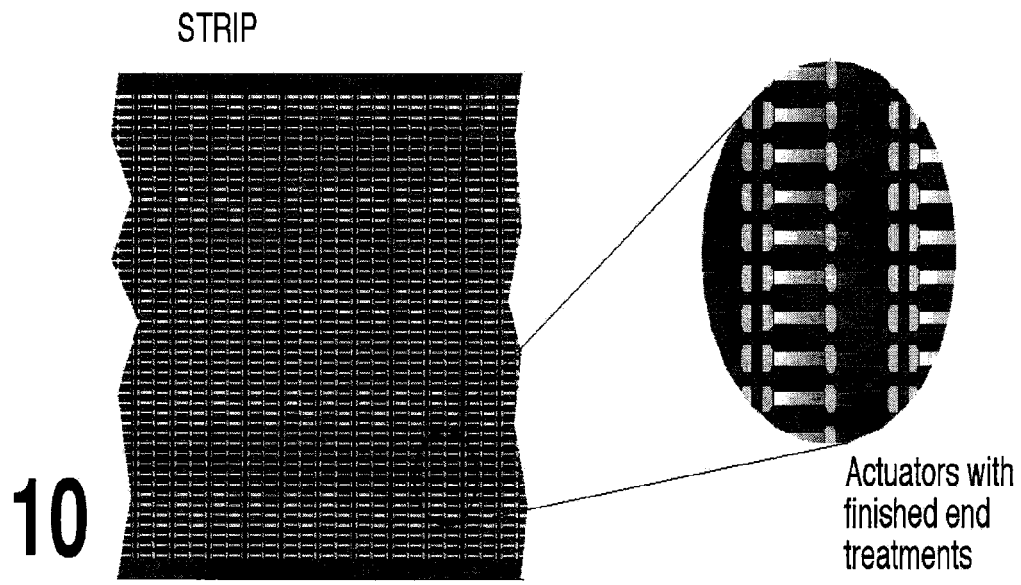
Figure 24M:
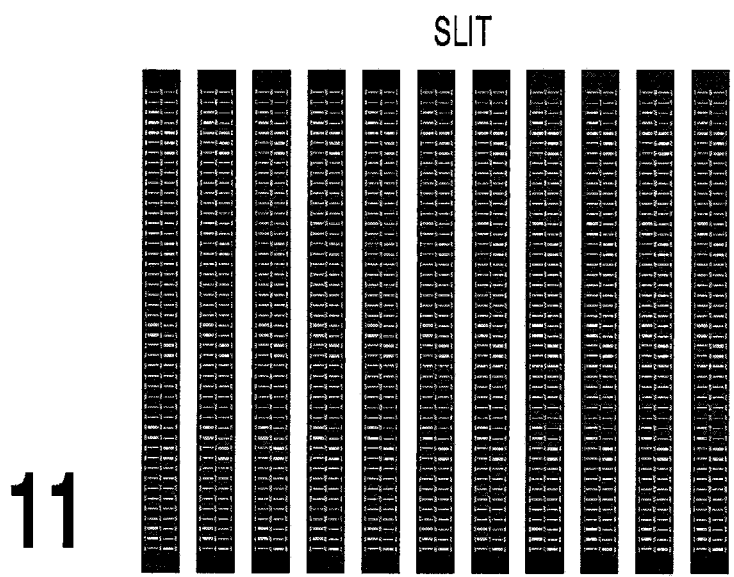

FIGS. 24a-24m depicts the formation of a series of actuators 32 according to the teachings of the present invention. The process begins with a long roll of Kapton, polyimide sheet or VN film or similar polymers such as UBE Upilex, capable of withstanding high temperatures without significant degradation. It is envisioned that the polymeric web substrate can vary in thickness from <8 micrometers to >100 micrometers depending on the requirements of the intended application. The web width might range from as little as 100 millimeters up to >1 meter. The polyimide sheet is first heated in vacuum to degas the material prior to deposition of the SMA film. When the web has been thus preconditioned, a thin film of binary TiNi alloy or other suitable shape-memory thin film such as TiNiX, where X=Hf, Zr, Au, Pd or Pt is deposited onto the polyimide sheet at a thickness greater than 1 to about 100 microns (FIG. 24b). The material TiNiX may then be optionally annealed in vacuum (FIG. 24c) at an elevated temperature to provide the proper crystal structure for optimum shape-memory performance.

Following SMA film deposition and annealing, the metallized sheet is placed under unidirectional or biaxial load while the SMA is in its martensitic (cool) condition in order to "program" the sheet material to later exhibit a linear contraction of from 1 to 6% of the active length on subsequent heating (FIG. 24e). The sheet may optionally be placed under load and cooled to induce the martensite phase, causing the sheet to be stretched by 2 to 5%. Optionally the process of stretching the sheet may be carried out in a number of thermomechanical cycles in which the sheet, while continuously under load sufficient to deform the martensite phase by 2 to 5%, is cyclically cooled below the martensite finish temperature and heated to above the austenite finish temperature, with the final cycle ending with the stretched martensitic film held at a temperature below the martensite finish temperature. This cyclic thermomechanical treatment may be carried out for a sufficient number of cycles to stabilize the hysteretic behavior of the films with respect to subsequent cycling in service. The process may be carried out either with uniaxial loads, biaxial loads, or loading by application of differential pressure across the membrane to cause biaxial bulge deformation. In any case, at the end of this step in the process, the raw actuator material is kept rigorously below the austenite start temperature for all subsequent processing, packaging and final end-user attachment steps. That is, the first instance of heating above the austenite start temperature is intended to occur only after the finished actuator element is installed in its final mechanical disposition.

Alternatively, additional surface treatments, described further below, can be applied after stretching to induce out-of-plane deformation on subsequent heating for either strip, multiaxial, or planar membrane material systems. The SMA metal film may be deposited on one or both sides of the polymeric web.

In production, the process may employ an arbitrarily complex series of cleaning, degassing, plasma treating, film deposition, post-deposition thermal treatment, additional deposition of specialized materials for end treatments, and so on. All such serial processes required by a specific application would be carried out in a continuous process, as shown schematically in FIG. 24a.

The stretched sheet of SMA metallized polymer is then subjected to final processing that may consist of photolithographically etching patterns in the metal layer to define electrical conduction paths (unless these have been provided by masked deposition as described above), preparing end connection points by such means as electroplating, applying encapsulation as required by the end-use, and cutting the sheet into individual linear or multiaxial elements. In particular, electroplating with a hard metal, such as nickel, gold, chromium, zinc, copper, or alloys thereof may be done to, for example, substantially thicken one or both ends of the actuator to impart sufficient mechanical rigidity for drilling or other machining of the end tabs (see FIGS. 24i-24k). This allows for the use of mechanical fasteners. An example of a patterned actuator with special end treatments is shown in FIG. 2, along with schematic depiction of the actuator stroke and electrical excitation means. Alternatively, the connection ends may be prepared for soldering by the end-user.

The shape-memory alloy is preferably the well-known NiTi intermetallic compound or related shape-memory metals, including but not limited to: TiNiPd, TiNiAu, TiNiZr, TiNiHf, or TiNiPt. The alloy is chosen to give desired actuation and service temperatures between −100 and as high as 500 centigrade.

Deposition may either produce a continuous metal film layer, or may be done in the presence of masks designed to produce a pattern in the metal film that defines special shapes for a multiplicity of actuators in the metal layer (such as reduced-sections and enlarged ends on a linear actuator element). In any case, the polymeric sheet is continuous.

The deposition process may involve post-deposition annealing procedures, conducted prior to the stretching step, to obtain the desired crystal structure and defect population for optimal shape-memory activity. Alternatively, control of composition may be used to confer pseudoelastic characteristics at the end-use temperature. Furthermore, special alloy formulations such as (Ti−Hf)Ni and Ti(Ni+Au, Pd, Pt) can be readily used to achieve high transformation temperatures (Af>225 C).

Further metallization may be performed to apply top-coatings to impart oxidation resistance or modify electrical conductivity. Localized coatings (via masks) can be applied to improve solderability or provide stiffness for mechanical attachment.

After stretching, the material is rigorously prevented from warming past the austenite-start temperature so that at the time of delivery to the end-user (and/or before further processing of functional membrane forms) the metallization remains "programmed" to produce uniaxial or biaxial contraction on heating.

As shown in FIG. 25m, slitting in the direction of the tensile stress axis may be required in certain cases of uniaxial deformation. The deposition process may optionally involve post-deposition annealing procedures to obtain the desired crystal structure and defect population for optimal shape-memory activity. Further metallization may be performed to apply final coatings to impart oxidation resistance, modify electrical conductivity, or provide localized coatings (via masks) to improve solderability or other attachment means at the ends of the actuator elements. Finally, individual actuator elements are cut from the film.

The description of the invention is merely exemplary in nature and, thus, variations that do not depart from the gist of the invention are intended to be within the scope of the invention. The actuators disclosed are applicable to a wide variety of actuation requirements such as biomedical devices and robotics, automotive applications such as mirror positioners, door locks, lamp manipulation, engine control devices; aerospace applications such as antenna and solar panel deployment mechanisms, dynamic figuring of optical elements, control of jet-engine mechanisms, alteration of aerodynamic surface forms, and many other applications in which very smooth, electrically excited mechanical actuation is required that develops large forces and displacements and can operate at low voltages in hostile and/or fluidic environments.

For example, the biaxial membrane form of the present invention can be used by way of non-limiting example, for regulating Osmotic pressure; Catalytic activity; Corrosion potential; Reflectivity/absorbance/Transmission of Visible, IR, RF radiation, particle beams; (including imaging, controlled phased arrays); surface acoustic properties (variable damping, resonator orifice control); flow control (variable fluid orifices, multiplexed microvalves, mixers); flow diversion, turbulence control (vanes and spoilers); selective drug delivery controllable drug patches; sensors; figuring of ultralight optics, flattening of LCD displays; localized kinetics for self cleaning, particle sorting and trap-release functions; wrapping/lining membranes, bearing liners, tubular active membranes, band brakes; operable mechanical fasteners such as unisex 'Velcro'; and shrink-fit materials. Such variations are not to be regarded as a departure from the spirit and scope of the invention.

What is claimed is:

1. A method for producing a plurality of thin film actuators comprising:
    a) degassing a polymer film in a vacuum;
    b) depositing a film of a shape memory alloy material onto the polymer film;
    c) imparting a strain to the polymer film by 2 to 8% strain; and
    d) cutting the polymer film in a plurality of directions after imparting a strain to the polymer to form a plurality of monolithic thin film actuators, said plurality of monolithic thin film actuators having generally the same size after the step of imparting a strain.

2. The method according to claim 1 wherein the polymer film is a polyimide film.

3. The method according to claim 1 wherein depositing a film of shape memory alloy is sputter coating a layer of shape memory alloy onto the polymer film.

4. The method according to claim 1 wherein depositing a film of shape memory alloy is depositing a film of shape memory alloy selected from the group consisting of TiNiPd, TiNiAu, TiNiZr, TiNiHf, TiNiPt and combinations thereof.

5. The method according to claim 1 wherein the step of imparting strain to the polymer film is imparting a uniaxial strain.

6. The method according to claim 1 wherein the step of imparting a strain is imparting biaxial strain.

7. The method according to claim 1 wherein the step of imparting a strain is done in a cyclic manner by heating and cooling under applied uniaxial or biaxial loading with the last cycle ending with strain applied in the fully martensitic condition.

8. The method of claim 1 further comprising the step of exposing the shape memory alloy layer to a photo resist mask prior to cutting the polymer film into a plurality of actuators.

9. The method according to claim 8 further comprising etching the shape memory alloy material prior to cutting the polymer film into a plurality of actuators.

10. The method according to claim 1 further comprising layering portions of the polymer film with a conductor.

11. The method according to claim 10 wherein the conductor is between 1 and about 100 microns thick.

12. The method according to claim 10 wherein the conductor is selected from the group consisting of Cu, Au, Ag, Ni, Cr and combinations thereof.

13. The method according to claim 1 further comprising the step of annealing the shape memory alloy.

14. The method according to claim 1 further comprising sputter coating a second layer onto the shape memory alloy layer.

15. The method according to claim 14 wherein the second sputter coat is a conduction layer.

16. The method according to claim 14 wherein the second layer is a plating assist layer.

17. The method according to claim 1 wherein cutting the polymer film is cutting the polymer film while not cutting the shape memory alloy.

18. A method for producing a plurality of thin film actuators comprising:
    a) sputter deposing a film of a shape memory alloy material onto a polyimide film to form a shape memory alloy construction;
    b) annealing the shape memory alloy construction;
    c) imparting a 2 to 8% strain to the shape memory alloy construction;
    d) conducting a post straining process on the shape memory alloy construction after the step of imparting a 2 to 8% strain; and
    e) cutting the shape memory alloy construction in a plurality of directions to form a plurality of monolithic thin film actuators, after imparting a 2% to 8% strain to the shape memory alloy construction, said plurality of monolithic thin film actuators having generally the same size after the step of conducting a post annealing process.

19. The method according to claim 18 wherein the step of imparting strain to the polymer film is imparting a uniaxial strain.

20. The method according to claim 18 wherein the step of imparting a strain is imparting biaxial strain.

21. The method according to claim 17 wherein depositing a film of shape memory alloy is depositing a film of shape memory alloy selected from the group consisting of TiNiPd, TiNiAu, TiNiZr, TiNiHf, TiNiPt and combinations thereof.

22. The method of claim 17 further comprising the step of exposing the shape memory alloy layer to a photo resist mask prior to cutting the polymer film into a plurality of actuators.

23. The method according to claim 17 further comprising etching the shape memory alloy material prior to cutting the polymer film into a plurality of actuators.

24. The method according to claim 17 wherein the step of imparting strain to the polymer film comprises the steps of:
placing the shape memory alloy construction over a die; and
applying differential pressure into the die to deform the shape memory alloy construction.

25. The method according to claim 24 further comprising subjecting the shape memory alloy layer to ion irradiation to a depth of about one-half the thickness of the shape memory alloy layer.

26. The method according to claim 25 wherein subjecting the shape memory alloy layer to heavy ion irradiation is subjecting the shape memory alloy layer with at least one of argon or krypton to damage the crystal structures to a degree that reverse transformation to the austenite is prevented.

27. The method according to claim 25 further comprising cutting the polymer film to form a plurality of thin film actuators after the step of imparting a strain.

28. The method according to claim 27 further comprising coupling two thin film actuators together to form a blister actuator.

29. A method for producing a plurality of thin film actuators comprising:
 a) sputter depositing a film of a shape memory alloy material onto a polymer film to form a shape memory alloy construction;
 b) imparting a 2 to 8% strain to the shape memory alloy construction;
 c) etching the shape memory alloy film; and
 d) cutting the shape memory alloy construction a plurality of times to form a plurality of monolithic thin film actuators after the step of etching the shape memory alloy film, and after the step of imparting a 2% to 8% strain to the shape memory construction.

30. The method according to claim 29 wherein the step of imparting strain to the polymer film is imparting a uniaxial strain.

31. The method according to claim 29 wherein the step of imparting a strain is imparting biaxial strain.

32. The method according to claim 29 further comprising etching the shape memory alloy film using a photolithographic method, wherein the polymer film is substantially unaffected by the photolithographic method.

* * * * *

UNITED STATES PATENT AND TRADEMARK OFFICE
CERTIFICATE OF CORRECTION

| | |
|---|---|
| PATENT NO. | : 7,690,621 B2 |
| APPLICATION NO. | : 10/553309 |
| DATED | : April 6, 2010 |
| INVENTOR(S) | : David S. Grummon |

It is certified that error appears in the above-identified patent and that said Letters Patent is hereby corrected as shown below:

Column 2, line 7, "out-of plane" should be --out-of-plane--.

Column 2, line 25, after "tens", insert --of--.

Column 2, line 47, after "linear", delete "and".

Column 3, line 26, "and actuator" should be --an actuator--.

Column 3, line 26, "an DVRT" should be --a DVRT--.

Column 3, line 37, "side views" should be --side view--.

Column 3, line 44, after "FIG. 16a", insert --;--.

Column 3, line 46, "FIGS. 16a-17d" should be --FIGS. 16a-16d--.

Column 3, line 47, "FIG. 20a-20b" should be --FIGS. 20a-20b--.

Figure 24N:
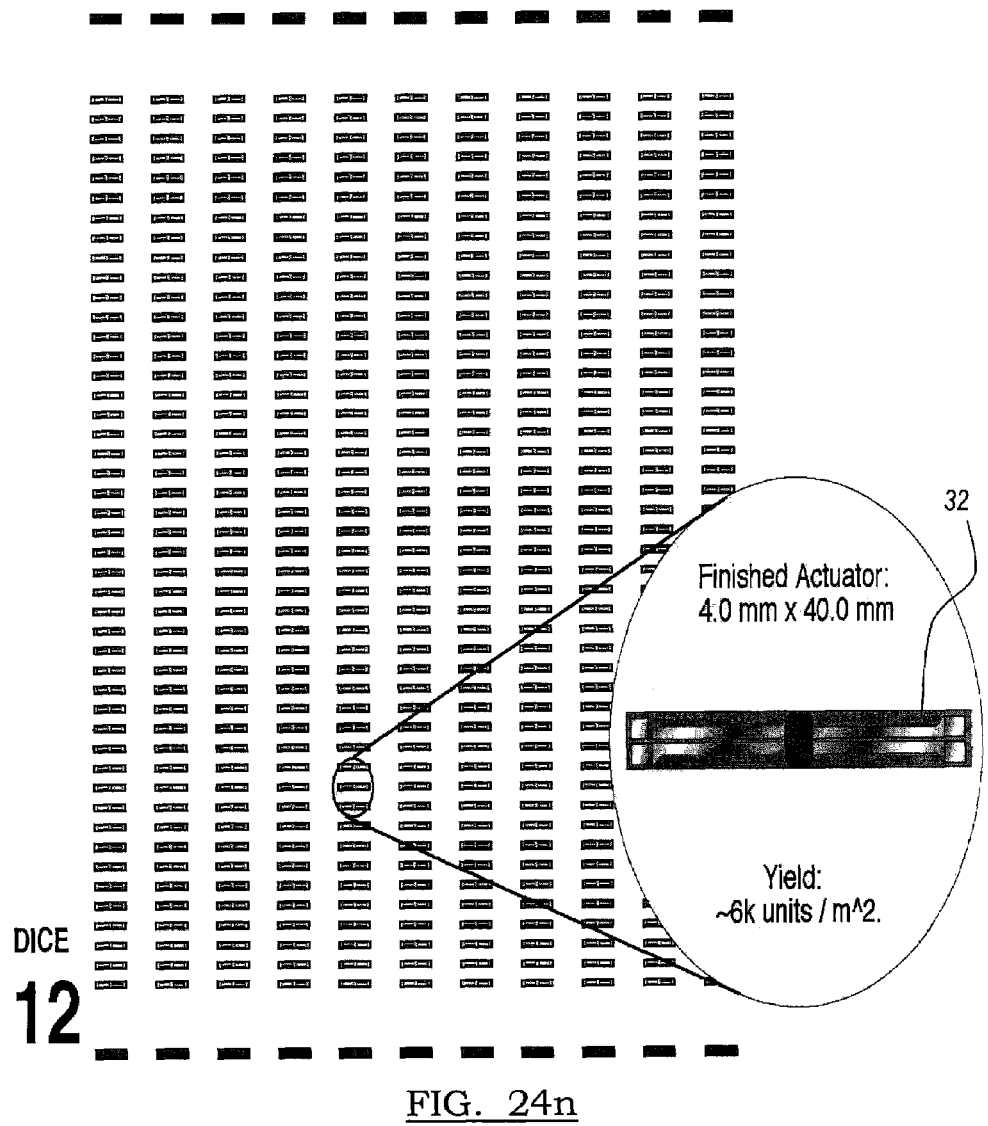

Column 3, line 54, "FIG. 24a-24n represents" should be --FIGS. 24a-24n represent--.

Column 4, line 56, "there between" should be --therebetween--.

Column 5, line 28, "FIG." should be --FIGS.--.

Column 6, line 40, "closed" should be --"closed"--.

Column 8, line 5, "out of plane" should be --out-of-plane--.

Column 8, line 25, "counter posed" should be --counterposed--.

Column 8, line 30, "complimentary" should be --complementary--.

Signed and Sealed this

Tenth Day of August, 2010

David J. Kappos
*Director of the United States Patent and Trademark Office*

Column 8, line 31, "me" should be --be--.

Column 8, lines 38-39, "complimentary" should be --complementary--.

Column 8, line 42, after "respect", insert --to--.

Column 12, line 61, Claim 21, "17" should be --18--.

Column 12, line 65, Claim 22, "17" should be --18--.

Column 13, line 1, Claim 23, "17" should be --18--.

Column 13, line 4, Claim 24, "17" should be --18--.